(12) United States Patent
Wennerlöf et al.

(10) Patent No.: US 10,103,824 B2
(45) Date of Patent: Oct. 16, 2018

(54) ANTENNA ALIGNMENT USING UNMANNED AERIAL VEHICLE

(71) Applicant: TELEFONAKTIEBOLAGET L M ERICSSON (PUBL), Stockholm (SE)

(72) Inventors: Ulf Wennerlöf, Öjersjö (SE); Anders Ahlström, Vallda (SE); Stefan Thöresson, Lindome (SE); Jan Sandberg, Frillesås (SE); Bengt-Erik Olsson, Hovås (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 117 days.

(21) Appl. No.: 14/785,901

(22) PCT Filed: Oct. 14, 2015

(86) PCT No.: PCT/EP2015/073822
§ 371 (c)(1),
(2) Date: Oct. 21, 2015

(87) PCT Pub. No.: WO2017/063695
PCT Pub. Date: Apr. 20, 2017

(65) Prior Publication Data
US 2017/0155456 A1    Jun. 1, 2017

(51) Int. Cl.
*H01Q 3/00* (2006.01)
*H04B 7/185* (2006.01)
*H04B 17/12* (2015.01)
*H01Q 3/08* (2006.01)
*H04W 16/18* (2009.01)

(52) U.S. Cl.
CPC .............. *H04B 17/12* (2015.01); *H01Q 3/08* (2013.01); *H04W 16/18* (2013.01)

(58) Field of Classification Search
None
See application file for complete search history.

(56) References Cited

U.S. PATENT DOCUMENTS

| | | | |
|---|---|---|---|
| 6,034,634 A | 3/2000 | Karlsson et al. | |
| 6,044,323 A * | 3/2000 | Yee | G08G 5/0013 342/352 |
| 6,335,705 B1 * | 1/2002 | Grace | G01S 7/4017 342/174 |
| 6,628,941 B2 * | 9/2003 | Knoblach | H04B 7/18576 455/431 |
| 6,817,161 B1 * | 11/2004 | Wu | B65D 81/113 206/308.1 |

(Continued)

OTHER PUBLICATIONS

Guo Yangzi et al. Development of active directional antennae for use in small UAVs. International Conference on Innovation, Communication, and Engineering, Oct. 26, 2013 (Oct. 26, 2013).

*Primary Examiner* — Trinh Dinh

(57) ABSTRACT

A system for antenna alignment of a directional antenna used for wireless communication with respect to a target location. The system comprising the directional antenna and an unmanned aerial vehicle, UAV, arranged to be deployed in relation to the target location. The system is configured for transmission of an alignment signal between the UAV and the directional antenna and also for measuring a level of antenna alignment of the directional antenna with respect to the target location, based on the alignment signal transmission.

20 Claims, 11 Drawing Sheets

(56) References Cited

U.S. PATENT DOCUMENTS

| | | | |
|---|---|---|---|
| 2010/0302101 A1 | 12/2010 | Leiba et al. | |
| 2011/0182230 A1* | 7/2011 | Ohm | H04B 7/185 370/315 |
| 2011/0286325 A1* | 11/2011 | Jalali | H04B 7/18506 370/221 |
| 2014/0056583 A1* | 2/2014 | Giddings | H04L 27/2663 398/44 |
| 2015/0236778 A1 | 8/2015 | Jalali | |
| 2015/0236779 A1* | 8/2015 | Jalali | H04B 7/18508 342/367 |
| 2015/0304885 A1* | 10/2015 | Jalali | H04L 5/006 370/329 |
| 2016/0036135 A1* | 2/2016 | Hellinger | H01Q 3/28 342/202 |

* cited by examiner

A1:
The DO configures the drone with the GPS coordinates for the future far-end antenna (including altitude).

A2:
The DO uses the drone-phone to call up the IT.

A3:
The DO sends up the drone to the prepared location and makes sure that the drone is oriented so the cone antenna is directed towards the aligning antenna.

A4:
The IT makes a rough alignment towards the drone using a compass and (if possible) visual sight of the drone.

A5a:
The IT listens to the sound signal in his phone sent from the drone-phone and adjusts the antenna until the feedback is at optimum.

A5b:
The IT listens to the sound signal in his phone sent from the drone-phone and adjusts the antenna until the sound has peaked.

A6:
Now the alignment is done. The IT hangs up the call from the drone-phone, calls up the DO and tells him that the mission is accomplished.

Fig 10

ANTENNA ALIGNMENT USING UNMANNED AERIAL VEHICLE

TECHNICAL FIELD

The present disclosure relates to wireless communication systems, and in particular to antenna alignment of directional radio antennas for point-to-point communication.

BACKGROUND

Directional antennas are antennas that concentrate transmitted and/or received signal power in one or more directions. Differently from isotropic antennas which have uniform radiation patterns, and thus the same antenna gain in all directions, directional antennas tend to have higher antenna gain in some directions. Directional antennas can therefore be used to improve communication conditions, but only if correctly aligned with respect to, e.g., a far-end antenna.

FIG. 1 shows a schematic view of a point to point communication system according to prior art. A directional antenna 101 is here shown to be aligned with respect to a far-end directional antenna 102. An adjustment module 110a, 110b is used to steer the antenna radiation pattern, i.e., to set 111 the direction of a main lobe or to adjust an orientation of an antenna radiation pattern. The adjustment module 110a, 110b may be purely mechanical or motorized. A motorized adjustment module is possibly also adjustable by remote control.

Directional antennas, such as dish antennas, are commonly used in point-to-point radio links operating at microwave frequencies. When deploying a point-to-point radio link it is necessary, due to the narrow main lobes involved, to make sure that the antennas on each side of the radio link, i.e., near-end and far-end antennas, are oriented towards each other with sufficient degree of accuracy. If such alignment is not achieved then the radio link performance will be degraded due to loss in antenna system gain.

A commonly used method for aligning a near-end radio link antenna with respect to a corresponding far-end antenna is based on measuring received signal strength at the near-end antenna with respect to an alignment signal transmission from the far-end antenna.

Consequently, this commonly used method requires that the far-end antenna is deployed, at least coarsely aligned with respect to the near-end antenna, and is actively transmitting some type of alignment signal. The measurement of received signal strength is often done using a Volt-meter attached to a measurement port of an alignment signal receiver connected to the near-end antenna. A technician adjusts orientation of the directional antenna in an attempt to maximize received signal strength. When the technician has tested some given range of antenna directions, he selects the orientation which gave the highest received signal strength, and the antenna is then considered aligned.

Of course, a reverse procedure where the far-end antenna is instead receiving an alignment signal transmission, is also possible, but not very common.

A drawback with this commonly used alignment procedure for aligning radio link antennas is that network roll-out must be planned carefully and antennas must be aligned in a certain sequence, since each new antenna alignment procedure requires an actively transmitting and coarsely aligned antenna on the other side of the radio link against which to align. Thus, aligning directional radio antennas is cumbersome and usually involves a lot of travel between near-end and far-end antennas, in particular during network roll-out when many directional antennas should be aligned at the same time.

Hence, there is a need for improvement of directional antenna alignment techniques.

SUMMARY

An object of the present disclosure is to provide systems, methods and devices which seek to mitigate, alleviate, or eliminate one or more of the above-identified deficiencies in the art and disadvantages singly or in any combination and to provide improved alignment of directional antennas.

This object is obtained by a system for antenna alignment of a directional antenna used for wireless communication with respect to a target location. The system comprises the directional antenna and an unmanned aerial vehicle (UAV) arranged to be deployed in relation to the target location. The system is configured for transmission of an alignment signal between the UAV and the directional antenna. The system is also configured for measuring a level of antenna alignment of the directional antenna with respect to the target location, based on the alignment signal transmission.

Hereby, the alignment state of the directional antenna is not evaluated with respect to a far-end antenna which has been deployed at the target location, at least coarsely aligned with respect to the directional antenna, and which is actively processing some type of alignment signal. Instead, the measuring of antenna alignment of the directional antenna is made with respect to the UAV.

Consequently, the level of alignment of a directional antenna with respect to a target location can be evaluated independently of any other antennas in the communication system, in particular a far-end antenna which has been deployed at the target location, at least coarsely aligned with respect to the directional antenna, and which is actively processing some type of alignment signal.

Advantageously, alignment of a microwave radio link directional antenna is hereby performed without first having to mount and activate transmission from a corresponding far-end antenna as discussed above. Evaluating alignment of a microwave radio link directional antenna with respect to a target location is therefore simplified.

Advantageously, antenna alignment level, i.e., whether a current setting of direction of a directional antenna is a preferred direction or not, with respect to a target location, can be determined in an efficient fashion for one or more radio links in a communication system, since there is no dependence on any other antennas in the communication system during evaluation due to the use of the UAV.

According to aspects, the directional antenna comprises an adjustment module. The adjustment module is arranged for aligning the directional antenna with respect to the target location based on the measured level of antenna alignment.

Hereby, alignment of the directional antenna is achieved independently of any other antennas, such as a corresponding far-end antenna of the directional antenna. Thus, by aligning the directional antenna with respect to the UAV instead of with respect to a far-end antenna which has been deployed at the target location, at least coarsely aligned with respect to the directional antenna, and which is actively processing some type of alignment signal, the process of antenna alignment is simplified, especially during network roll-out where many directional antennas are deployed at the same time.

Advantageously, a technician does not need to travel back and forth between antenna sites during antenna deployment and alignment, which saves time and reduces cost of antenna deployment.

Advantageously, many radio links can be installed in parallel since there is no need for a far-end antenna transmitting an alignment signal. Cost of network roll-out is also reduced since there need only be personnel on one site at a time, and the travel between sites is reduced.

The object is also obtained by a method for measuring antenna alignment of a directional antenna used for wireless communication with respect to a target location. The method comprises deploying an unmanned aerial vehicle (UAV) in relation to the target location, transmitting an alignment signal between the UAV and the directional antenna, and measuring a level of antenna alignment of the directional antenna with respect to the target location, based on the alignment signal transmission.

Hereby, as for the above-mentioned system, the level of alignment of the directional antenna with respect to the target location can be evaluated independently of any other antennas in a communication system, such as a corresponding far-end antenna of the directional antenna. There is no need for deploying and activating transmission from a far-end antenna during alignment evaluation, since evaluation is made with respect to the UAV instead of with respect to the far-end antenna Thus, evaluating alignment of a directional antenna with respect to a target location is simplified.

According to aspects, the method also comprises aligning the directional antenna with respect to the target location by adjusting a direction of the directional antenna in a direction that improves the measured level of antenna alignment.

Hereby, alignment of the directional antenna is achieved independently of any other antennas, such as a corresponding far-end antenna of the directional antenna. Thus, by aligning the directional antenna with respect to the UAV instead of with respect to an already active far-end antenna, the process of antenna alignment is simplified, especially during network roll-out. Advantageously, a technician does not need to travel back and forth between antenna sites during antenna deployment and alignment.

In addition to the methods there is disclosed herein computer programs comprising computer program code which, when executed in a UAV or in connection to a directional antenna, causes the UAV or directional antenna to execute a method as disclosed herein.

The object is furthermore obtained by an unmanned aerial vehicle (UAV) for aligning a directional antenna used for wireless communication with respect to a target location. The UAV is arranged for deployment in relation to the target location, and comprises an antenna alignment module configured for transmission of an alignment signal between the UAV and the directional antenna. The transmission comprises any of transmitting and receiving the alignment signal. The alignment signal is arranged to indicate a level of antenna alignment of the directional antenna with respect to the target location.

Hereby, as discussed above in connection to the systems and methods, improved directional antenna alignment is facilitated, since alignment or evaluation of alignment of a directional antenna can be made with respect to said UAV rather than with respect to a far-end antenna which has been deployed at the target location, at least coarsely aligned with respect to the directional antenna, and which is actively processing some type of alignment signal.

It is appreciated that the computer programs and UAVs all display additional advantages corresponding to advantages mentioned above in connection to the disclosed systems and methods.

BRIEF DESCRIPTION OF THE DRAWINGS

The present disclosure will now be described in more detail with reference to the appended drawings, where

FIG. 10 shows a flowchart illustrating methods according to aspects of the present disclosure.

DETAILED DESCRIPTION

Figure 1:
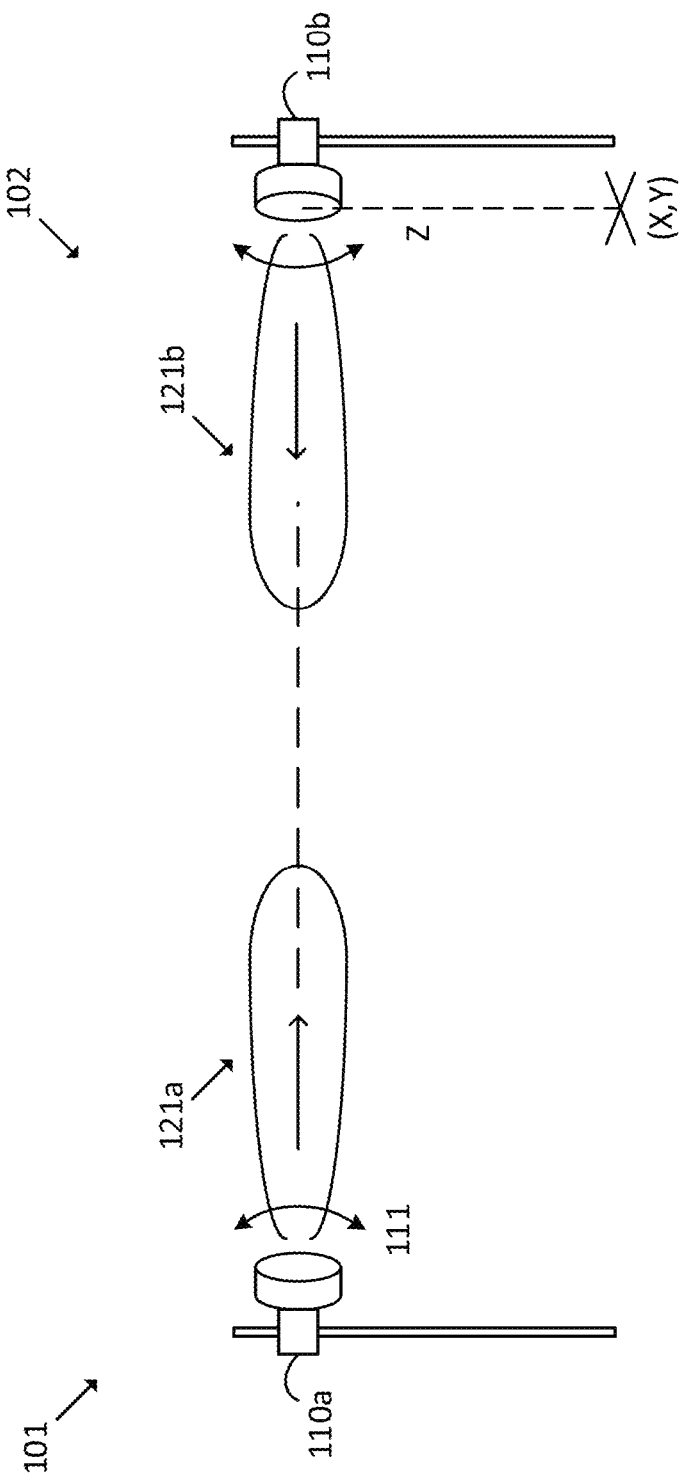
FIG. 1 shows a schematic view of a point to point communication system according to prior art.

Aspects of the present disclosure will now be described more fully with reference to the accompanying drawings. The different devices, computer programs and methods disclosed herein can, however, be realized in many different forms and should not be construed as being limited to the aspects set forth herein. Like numbers in the drawings refer to like elements throughout.

The terminology used herein is for the purpose of describing particular aspects of the disclosure only, and is not intended to limit the invention. As used herein, the singular forms "a", "an" and "the" are intended to include the plural forms as well, unless the context clearly indicates otherwise.

The solution described herein achieves improvements of antenna alignment and antenna alignment procedures by making antenna alignment, or evaluation of antenna alignment, with respect to a target location independent of the remote antenna which is or will be deployed, at or in a vicinity of the target location. This independence is achieved by using an unmanned aerial vehicle (UAV) to align or evaluate alignment against, instead of aligning or evaluating alignment against a far-end antenna which has been deployed at the target location, at least coarsely aligned with respect to the directional antenna, and which is actively processing some type of alignment signal.

According to the present teaching, there is no need to first have a far-end antenna a-priori deployed, coarsely aligned, and actively transmitting in order to be able to evaluate alignment or to align a near-end antenna. According to the techniques described herein, the UAV assumes the role of a far-end antenna which has been deployed at the target location, at least coarsely aligned with respect to the directional antenna, and which is actively processing some type of alignment signal. Evaluation of antenna alignment state, as well as the process of antenna alignment, is therefore achieved independently of the far-end antenna, which can be mounted and activated after antenna alignment has been evaluated for the near-end antenna.

According to aspects, UAV herein refers to a drone, or any other un-manned aerial vehicle which can be flown to and be made to stay at a target location. In particular, the UAVs discussed herein may be referred to as unmanned aerial systems (UAS).

Herein, target location may refer to a position in three dimensions, or to a flight path as will be further discussed below.

Herein, the two directional antennas of a point-to-point communications link are referred to as near-end antenna and far-end or remote antenna, respectively. Unless otherwise stated, the near-end antenna is the antenna for which alignment is evaluated, or which is aligned, with respect to the far-end or remote antenna that is or will be deployed at the target location.

Herein, aligning of two antennas means that antenna radiation patterns 121*a*, 121*b* are matched to each other. For instance, a directional antenna may have a single main lobe as illustrated in FIG. 1, in which case the main lobes 121*a*, 121*b* should point towards each other for maximum system antenna gain. There are also directional antennas that have more than one main lobe, or an irregular radiation pattern. Such antennas may still need aligning with respect to a far-end antenna radiation pattern.

Figure 2:
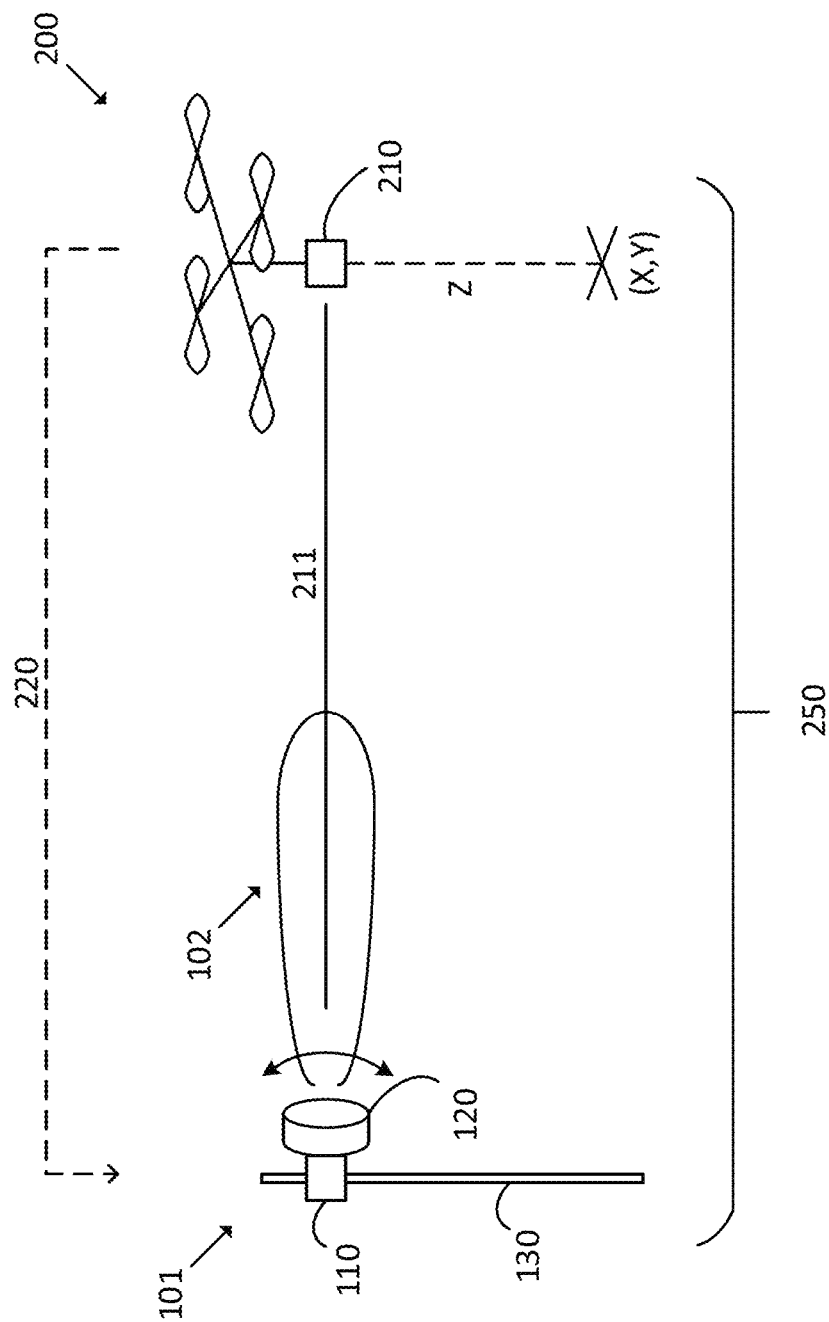
FIGS. 2, 3a, and 3b illustrate antenna alignment of directional antennas according to embodiments.

Some of the main differences between the novel solutions described herein and prior art can be understood from comparing FIGS. 1 and 2. Suppose in FIG. 1 that the left-hand side directional antenna 101 is to be aligned with respect to a target location X,Y,Z. To align this left-hand side directional antenna 101 according to prior art, one first deploys the right-hand side antenna 102 at the target location, coarsely directs it towards the left-hand side antenna, and configures it for transmission (or reception) of an alignment signal. This requires personnel at the target location in order to deploy the far-end antenna and to activate the alignment signal processing. The left-hand side directional antenna can then be aligned based on the alignment signal transmission. For instance, alignment can be achieved by sweeping the antenna main lobe 121*a* over some range of bearing and azimuth angles, and determining a direction which, e.g., gives highest received power. Highest received power may be determined, e.g., by means of the Volt-meter mentioned above.

Comparing FIG. 1 to FIG. 2, which illustrates antenna alignment of directional antennas according to embodiments, the main difference is absence of the far-end antenna 102. Instead, there is illustrated in FIG. 2 a system 250 for antenna alignment of a directional antenna 101 used for wireless communication with respect to a target location X,Y,Z. The system comprises the directional antenna 101, and an unmanned aerial vehicle (UAV) 200 arranged to be deployed in relation to the target location X,Y,Z. The system 250 is configured for transmission of an alignment signal 211 between the UAV 200 and the directional antenna 101. The system 250 is also configured for measuring a level of antenna alignment of the directional antenna 101 with respect to the target location X,Y,Z, based on the alignment signal transmission.

So, in FIG. 2 there is no right-hand side antenna 102. The UAV 200 instead assumes the role of the far-end antenna 102 in FIG. 1. Hence, the level of alignment of the directional antenna 101 with respect to the target location X,Y,Z can be measured independently of any far-end antenna. As a consequence, the alignment of the directional antenna 101 with respect to the target location X,Y,Z can be measured without having any personnel at the target location, and without having a far-end antenna which has been deployed at the target location, at least coarsely aligned with respect to the directional antenna, and which is actively processing some type of alignment signal as was the case in FIG. 1.

The UAV 200 being arranged to be deployed in relation to the target location X,Y,Z is to be construed, according to different aspects, as any of

- the UAV 200 being arranged to be deployed at the target location X,Y,Z, or as
- the UAV 200 being arranged to be deployed at a location having a known geometrical relationship with the location of the directional antenna and with the target location, e.g., along a straight line from the directional antenna to the target location, or as
- the UAV 200 being arranged to be deployed along a flight path in a vicinity of the target location.

According to some aspects, the directional antenna 101 comprises an adjustment module 110. The adjustment module 110 is arranged for aligning the directional antenna 101 with respect to the target location based on the measured level of antenna alignment.

The proposed techniques can be used to evaluate an alignment state or level of alignment of the directional antenna 101 with respect to the target location, and also to actually align the directional antenna with respect to the target location, i.e., to improve the alignment level of the directional antenna 101 with respect to the target location X,Y,Z. It is noted that these are two different, although related, operations.

The operation of aligning a directional radio antenna comprises evaluating alignment, possibly followed by adjusting a direction of the directional antenna to improve on the level of alignment.

The operation of evaluating alignment of a directional antenna with respect to a target location can be performed in its own right, e.g., in already existing networks as a maintenance operation, in order to check if some alignment optimization is warranted.

The operation of evaluating alignment of a directional antenna does not necessarily imply that the antenna direction or orientation will be changed following the evaluation.

As discussed below in connection to FIGS. 5 and 6, not only alignment of direction or orientation of the directional antenna can be measured and/or adjusted, but also polarization alignment. Polarization of a polarized directional antenna can be adjusted by rotating the antenna to adjust horizontal and vertical planes of the directional antenna.

Figure 3A:
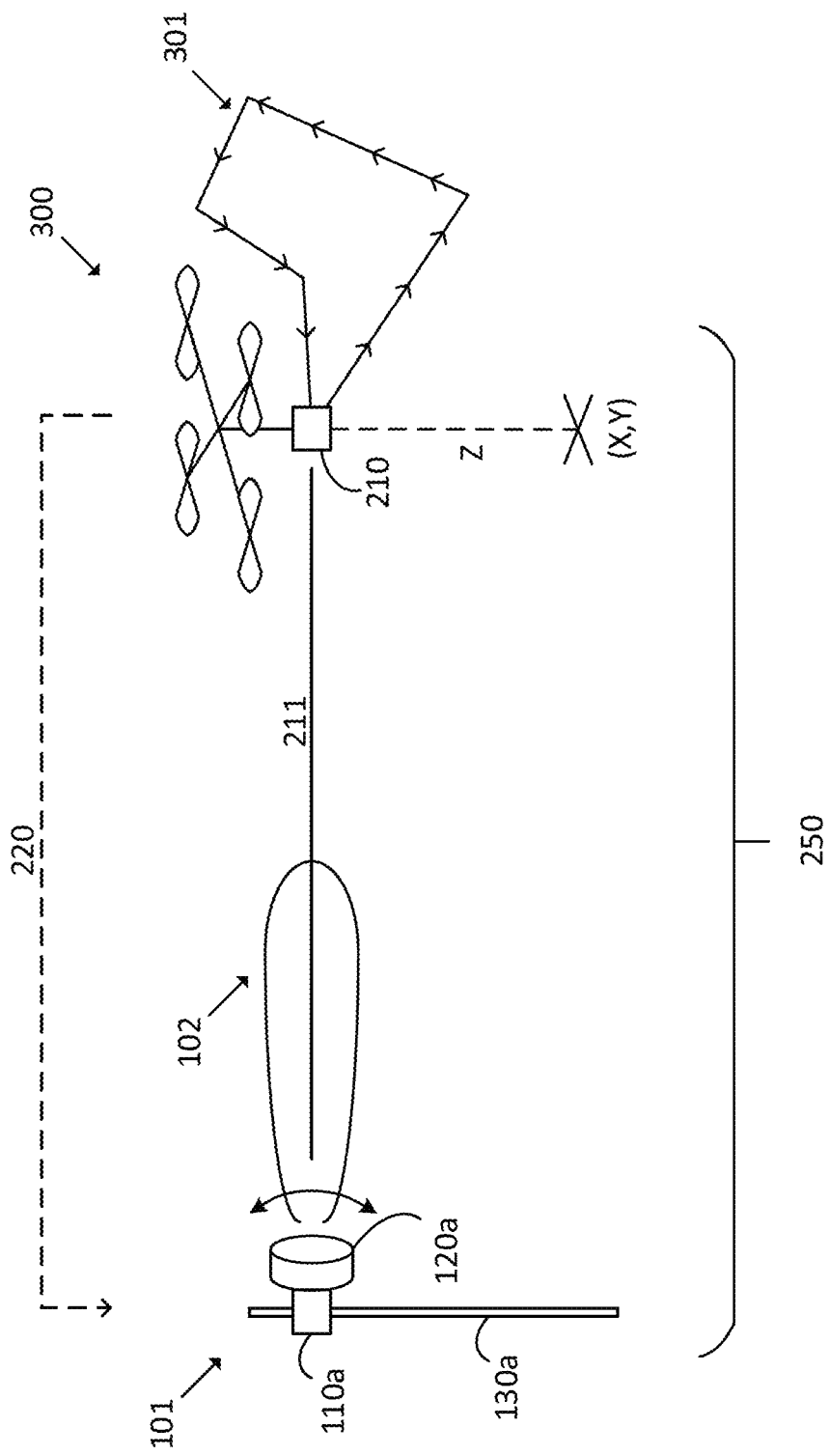

FIG. 3*a* illustrates antenna alignment of directional antennas according to embodiments. Here, the UAV is shown to not be still at a fixed target location X,Y,Z, but to move along a flight path 301 in a vicinity of the target location. I.e., the UAV 300, according to some aspects, is arranged to be deployed along a flight path 301 in a vicinity of the target location X,Y,Z.

This type of operation may be preferred in order to evaluate if a current direction of the directional antenna 101 is a preferred direction or if some other direction would give better communication conditions, without actually changing orientation of the directional antenna. I.e., as the UAV moves along the flight path, alignment of the directional antenna, keeping the directional antenna main lobe fixed in a current direction, with respect to the current location of the UAV can be evaluated. If alignment of the directional antenna is better when the UAV is at some point in the flight path other than the target location, then re-alignment or adjustment of orientation of the directional antenna 101 can be considered. Advantageously, this operation can be performed during network operation, since connectivity of the point-to-point radio link is not jeopardized by changing direction of any of the directional antennas during alignment evaluation.

FIGS. 2 and 3a illustrate a UAV deployed at or in a vicinity of the target location X,Y,Z. However, the UAV can be deployed in relation to the target location, at some other known location X',Y',Z' relative to the target location. This concept is exemplified in FIG. 3b.

Antenna alignment evaluation and antenna alignment of the directional antenna 101 with respect to the target location can be derived or performed, respectively, based on a known relationship between the actual location of the UAV X',Y',Z', the location of the directional antenna 101, and the target location X,Y,Z. For instance, the UAV may be located anywhere along a straight line 310 extending from the location of the directional antenna 101 to the target location X,Y,Z in order to evaluate a level of alignment of the directional antenna with respect to the target location. It is appreciated that a directional antenna 101 aligned with respect to some point X',Y',Z' on said line will necessarily also be aligned with respect to the target location X,Y,Z.

Consequently, throughout this disclosure, deploying the UAV 200, 300, 400 in relation to the target location X,Y,Z is to be understood, according to different aspects, as deploying the UAV at the target location X,Y,Z, or deploying the UAV at a location having a known geometrical relationship with the location of the directional antenna and with the target location, or deploying the UAV along a flight path 301 in a vicinity of the target location. Similarly, the UAV is, according to different aspects, arranged to be deployed at the target location X,Y,Z, or at a location having a known geometrical relationship with the location of the directional antenna and with the target location, or along a flight path in a vicinity of the target location.

Figure 3B:
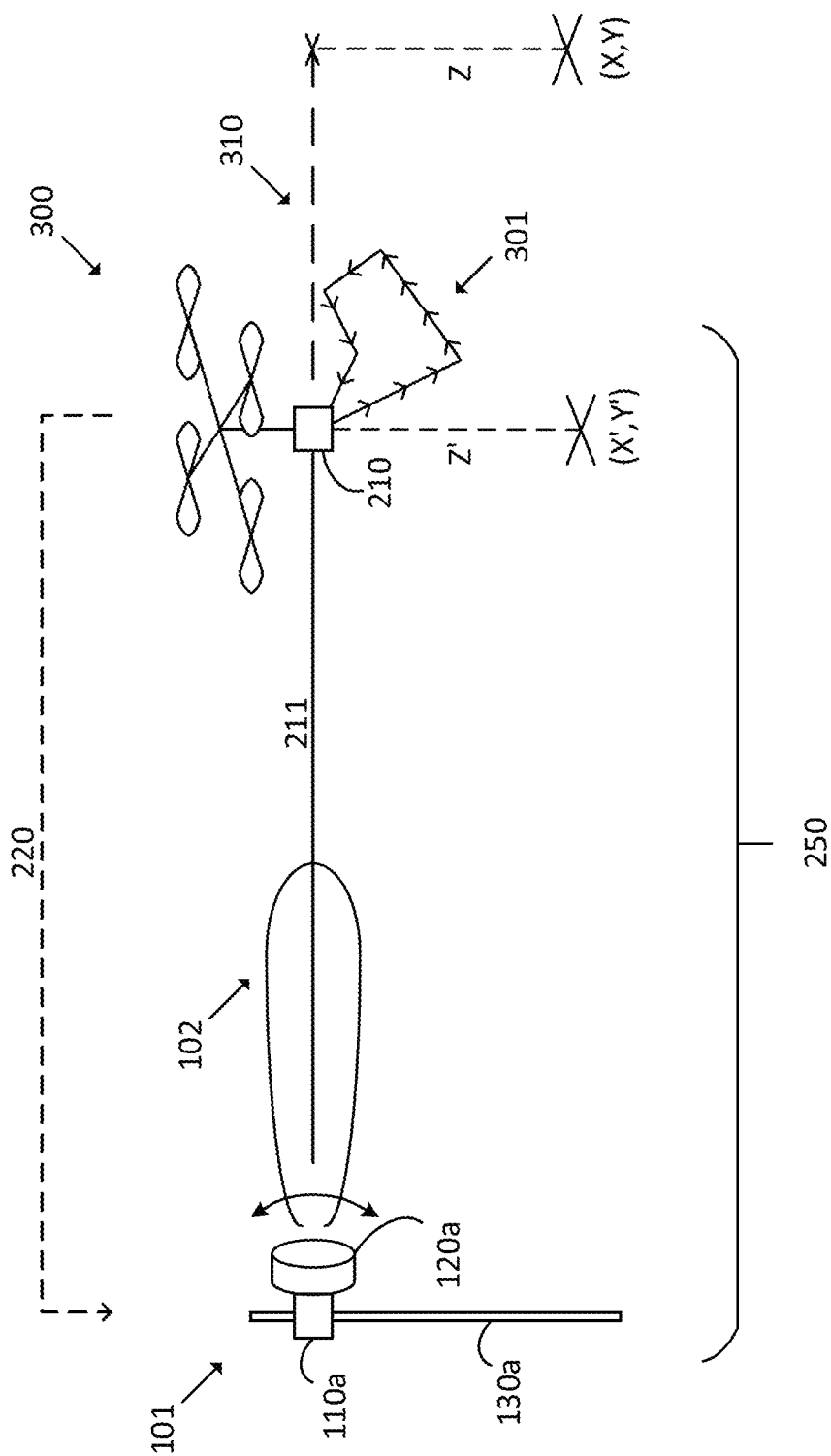

It is understood that said flight path 301 is, according to aspects, defined at a point in-between the directional antenna 101 and the target location X,Y,Z, e.g., in a vicinity of a point on the straight line 310 shown in FIG. 3b.

Figure 4:
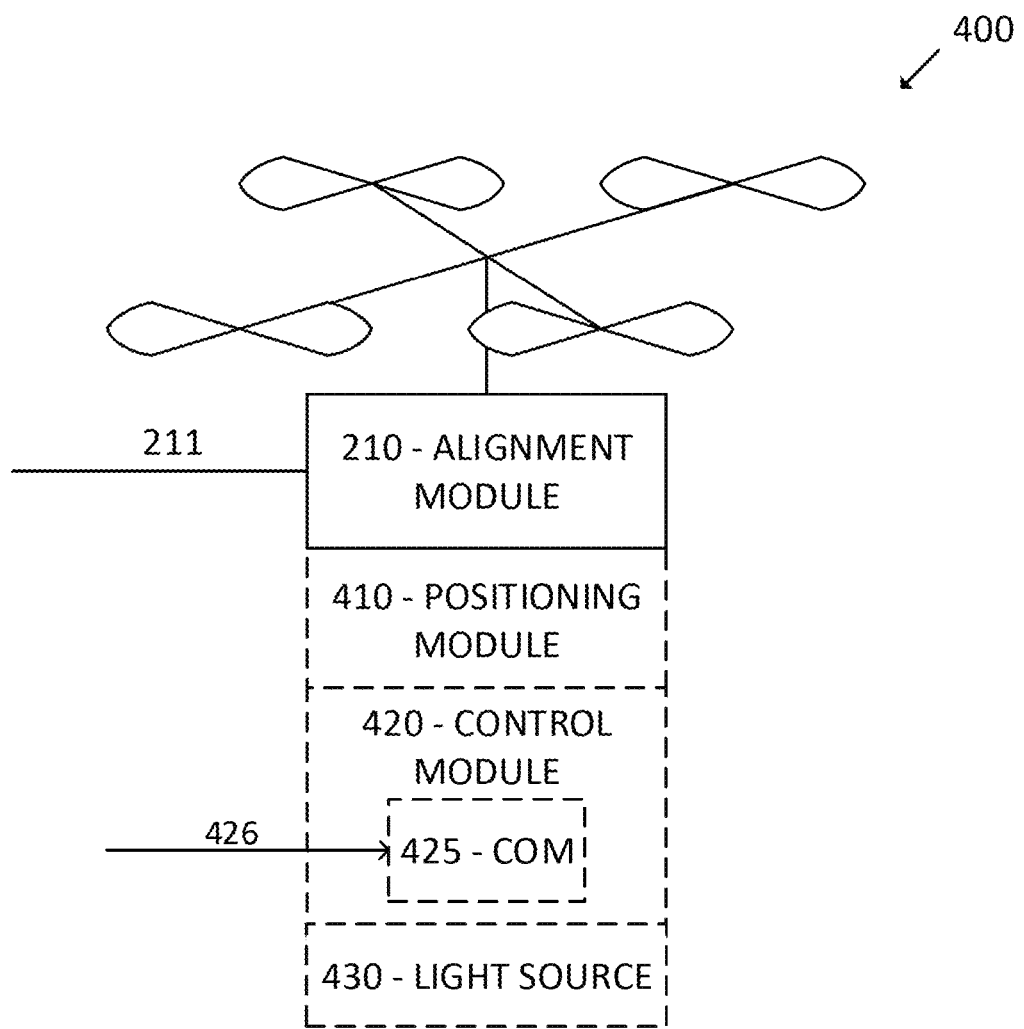
FIGS. 4-6 show schematic views of unmanned aerial vehicles according to embodiments.

Turning now to details of the UAV; FIG. 4 shows a schematic view of an unmanned aerial vehicle according to embodiments. In particular, there is shown a UAV 400 for aligning a directional antenna 101 used for wireless communication with respect to a target location X,Y,Z. The UAV 400 is arranged for deployment in relation to the target location X,Y,Z. The UAV comprises an antenna alignment module 210 configured for transmission of an alignment signal 211 between the UAV 200 and the directional antenna 101. The transmission comprises any of transmitting and receiving the alignment signal. The alignment signal is arranged to indicate a level of antenna alignment of the directional antenna 101 with respect to the target location X,Y,Z.

So, by deploying the UAV 400 illustrated in FIG. 4 at a target location, a directional antenna 101 can be aligned with respect to the UAV instead of with respect to a deployed and actively transmitting far-end antenna. Alternatively, a level of alignment of a directional antenna with respect to a target location can be measured by using the UAV 400 illustrated in FIG. 4.

The level of alignment of the directional antenna 101 with respect to the target location is evaluated independently of any other antennas in the communication system, in particular a far-end antenna which has been deployed at the target location, at least coarsely aligned with respect to the directional antenna, and which is actively processing some type of alignment signal.

Advantageously, antenna alignment level, i.e., whether a current setting of direction of a directional antenna is a preferred direction or not, with respect to a target location, can be determined in an efficient fashion for one or more radio links in a communication system, since there is no dependence on any other antennas in the communication system during evaluation due to the use of the UAV.

Advantageously, a technician does not need to travel back and forth between antenna sites during antenna deployment and alignment, which saves time and reduces cost of antenna deployment.

Advantageously, many radio links can be installed in parallel since there is no need for a far-end antenna transmitting an alignment signal. Cost of network roll-out is also reduced since there need only be personnel on one site at a time, and the travel between sites is reduced.

As mentioned above, according to some aspects the UAV 400 is arranged to be deployed at a position having a known relationship with the target location and with the location of the directional antenna, as discussed in connection to FIG. 3b above.

According to aspects, the UAV 400 further comprises a positioning module 410 arranged to determine a current position of the UAV 400. This positioning module is, according to aspects, arranged to determine a position of the UAV by means of, e.g., the Global Positioning System (GPS) or any other suitable satellite or terrestrial positioning system.

According to aspects, the UAV 400 also comprises a control module 420 arranged to control a position of the UAV 400. The control module can be used to fly or otherwise re-locate the UAV to the target location, or to a position having a known geometrical relationship to the target location and to the directional antenna, such as a point along the straight line discussed in connection to FIG. 3b, and to stay or hover at said position or target location, or to move along the above-mentioned flight path 301.

According to some aspects, the control module 420 is arranged to control the position of the UAV 400 based on a current position of the UAV determined by the positioning module 410 and on the target location X,Y,Z. Thus, any discrepancy between actual location of the UAV and target location can be automatically corrected for by the control module 420. Of course, any discrepancy between actual location of the UAV and a position having a known geometrical relationship to the target location, such as exemplified and discussed in connection to FIG. 3b, can also be automatically corrected for by the control module 420, given the location of the directional antenna 101.

According to some other aspects, the control module 420 is arranged to control the position of the UAV 400 based on an external control signal 426 received from a remote location via a communications module 425 comprised in the control module 420. This external control signal provides for the possibility of remote control of the UAV, e.g., by means of remote control radio transmitter. Thus, a technician may obtain control of the UAV and deploy the UAV manually at the target location, or at any other location of his choosing.

Alignment of a near-end antenna, such as the directional antenna 101 shown in FIG. 2, using the UAV can be performed in at least two different ways. Either the directional antenna 101 is arranged to transmit an alignment signal which the UAV is configured to receive, or the UAV is configured to transmit an alignment signal which the directional antenna is configured to receive.

In cases where the UAV is configured to receive the alignment signal, the directional antenna is first coarsely aligned with respect to the UAV, and then transmission of an alignment signal from the directional antenna to the UAV is activated. The UAV receives the alignment signal and evaluates some characteristics of the received alignment signal, such as received signal strength which is one example of a measure of signal quality. The UAV then reports back to the operator how it experiences the received alignment signal by transmitting an antenna alignment level measurement report back towards the directional antenna, or to some other operator location or antenna control entity. The directional antenna can then be aligned by trying different directions or orientations until a preferred direction or orientation is identified based on reports from the UAV. Cases where the UAV is configured to receive the alignment signal are discussed below in connection to FIG. 5.

In cases where the UAV is configured to transmit the alignment signal to the directional antenna, the directional antenna is first coarsely aligned with respect to the UAV. The alignment signal is then received from the UAV via the directional antenna and some characteristics of the received signal are used as measure of alignment of the directional antenna. For instance, received signal strength can be used, in which case a direction of the directional antenna yielding higher signal strength represents better alignment than a direction yielding low received signal strength. The Voltmeter discussed above can be used for the purpose of measuring received signal strength, given that a receiver connected to the directional antenna is equipped with a suitable received signal strength measurement port. The directional antenna can thus be aligned by trying different directions or orientations until a preferred direction or orientation is identified based on the received alignment signal. Cases where the UAV is configured to transmit the alignment signal are discussed below in connection to FIG. 6.

Of course, combinations of the two cases above are also possible, i.e., the UAV and directional antenna can both transmit and receive alignment signals. This can be expected to lead to improvements in alignment accuracy. Furthermore, more than one signal quality measure can be evaluated in parallel.

Herein, signal quality may, according to different aspects, comprise any of measured or estimated; received signal strength, bit-error rate, packet-error rate, block-error rate, mutual information between the directional antenna and the UAV, or log-likelihood ratio.

To make it easier to visually observe the UAV it, according to aspects, is equipped with a light source 430 that makes it more visible during dark operating conditions, e.g., at night.

Figure 5:
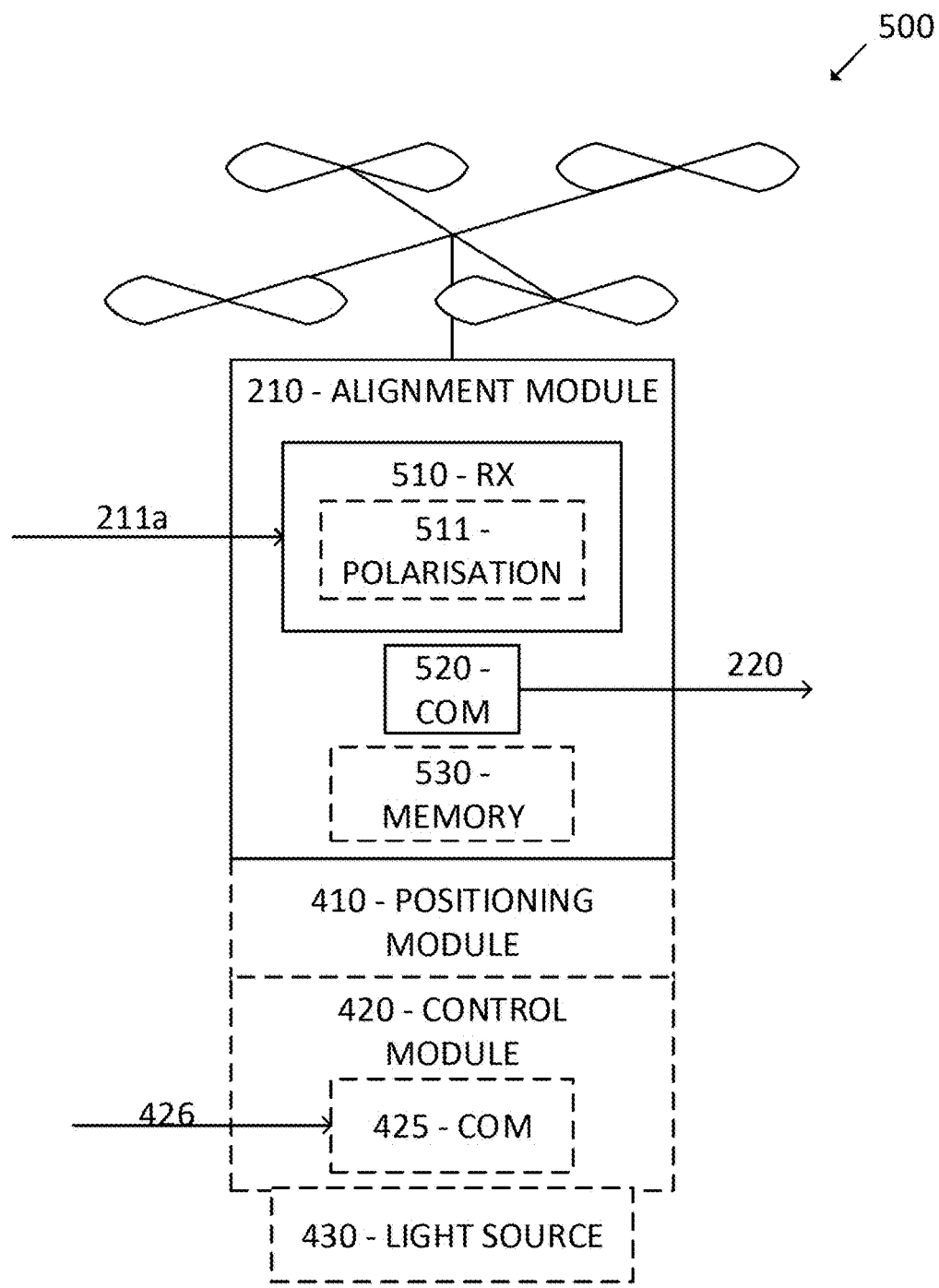

FIG. 5 illustrates embodiments where the UAV 500 is configured to receive the alignment signal 211a.

Here, the alignment module 210 comprises a receiver module 510 arranged to receive the alignment signal 211a from the directional antenna 101.

According to some aspects, the alignment module 210 is arranged to measure a signal quality of the received alignment signal. This signal quality may, according to different aspects, comprise any of measured or estimated; received signal strength, bit-error rate, packet-error rate, block-error rate, mutual information between the directional antenna and the UAV, or log-likelihood ratio.

According to aspects, the alignment module 210 is arranged to generate and transmit an antenna alignment level measurement report 220, based on the measuring of signal quality, to a control entity of the directional antenna 101. The antenna alignment level measurement report can be transmitted to the control entity over various communication channels. Examples of such communication channels comprise a cellular communications network such as Global System for Telecommunications (GSM), 3G, or Long Term Evolution (LTE). It is also possible to use a wireless local area network implementing, e.g., Wi-Fi, or a proprietary communications link for transmission of the antenna alignment level measurement report 220.

According to aspects, the receiver module 510 comprises a polarization module 511 defining a reference polarization of the UAV 500. The antenna alignment level measurement report 220 may then also indicate a mismatch between a polarization of the received alignment signal 501 and said reference polarization. Consequently, not only direction-alignment of the directional antenna can be measured and/or adjusted, but also polarization alignment. Polarization of a directional antenna can be adjusted by rotating the directional antenna 101 to adjust horizontal and vertical planes of the directional antenna 101.

According to aspects, the UAV 500 further comprises a memory module 530 arranged to record and store information relating to received signal quality and/or relating to the antenna alignment level measurement report.

This memory module may also be used to transmit the antenna alignment level measurement report back to the operator. In this case, the UAV is deployed and makes alignment measurements based on a received alignment signal. The UAV then stores results of measurements in the memory module 530, which can be accessed later by an operator interested in details of the alignment measurements.

Figure 6:
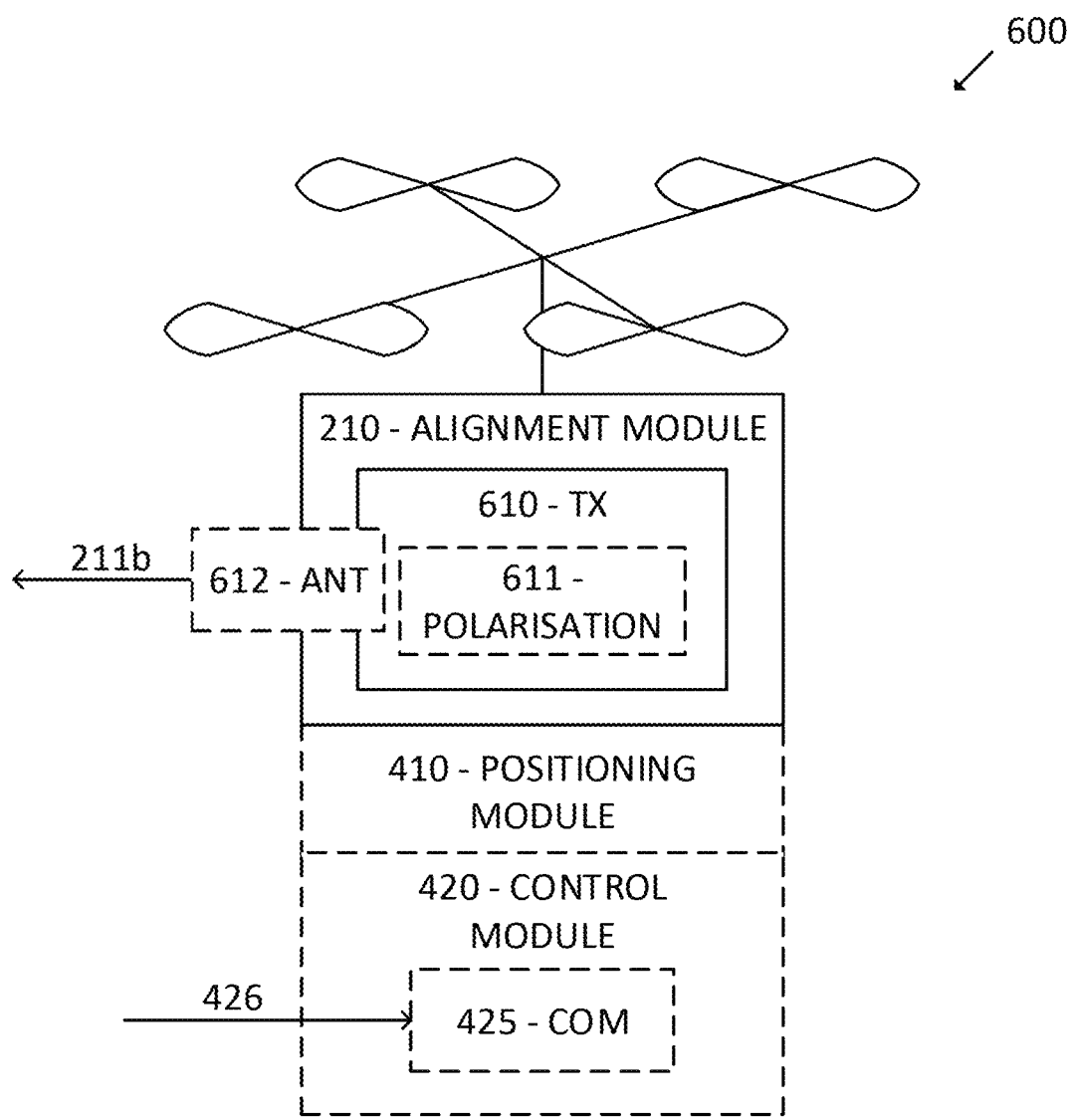

FIG. 6 illustrates embodiments where the UAV 600 is configured to transmit the alignment signal 211b.

Here, the alignment module 210 comprises a transmitter module 610 arranged to generate and transmit the alignment signal 211b towards the directional antenna 101 by means of an antenna 612.

The antenna 612 is, according to some aspects, arranged to radiate signal power in a plurality of directions.

The antenna 612 is, according to some aspects, an isotopically radiating antenna.

According to aspects, the transmitter module 610 comprises an on-board directional antenna, i.e., the antenna 612 is a directional antenna, such as a horn antenna. This on-board directional antenna is arranged to be oriented or directed towards the directional antenna 101. In this way, the alignment signal can be transmitted from the UAV 600 to the directional antenna 101 without needlessly interfering with other receivers spatially separated from the directional antenna 101.

According to aspects, the positioning module 410 is further arranged to determine a current direction of the on-board directional antenna. Such current direction may, e.g., be determined by means of a compass or other direction-finding device.

According to aspects, the control module 420 is further arranged to control the direction of the on-board directional antenna to be directed towards the directional antenna 101. Thus, automatic control of transmit direction by the UAV is achieved.

According to aspects, the transmitter module 610 comprises a polarization module 611 defining a reference polarization for transmission of the alignment signal. Again, not only direction-alignment of the directional antenna can be measured and/or adjusted, but also polarization alignment. By means of the present aspects, the polarization of the directional antenna can be adjusted with respect to the reference polarization of the UAV. If more directional antennas are adjusted in polarization with respect to the same reference polarization, according to aspects with respect to the same UAV, then the directional antennas can be expected to be aligned in polarization with respect also to each other.

Figure 7:
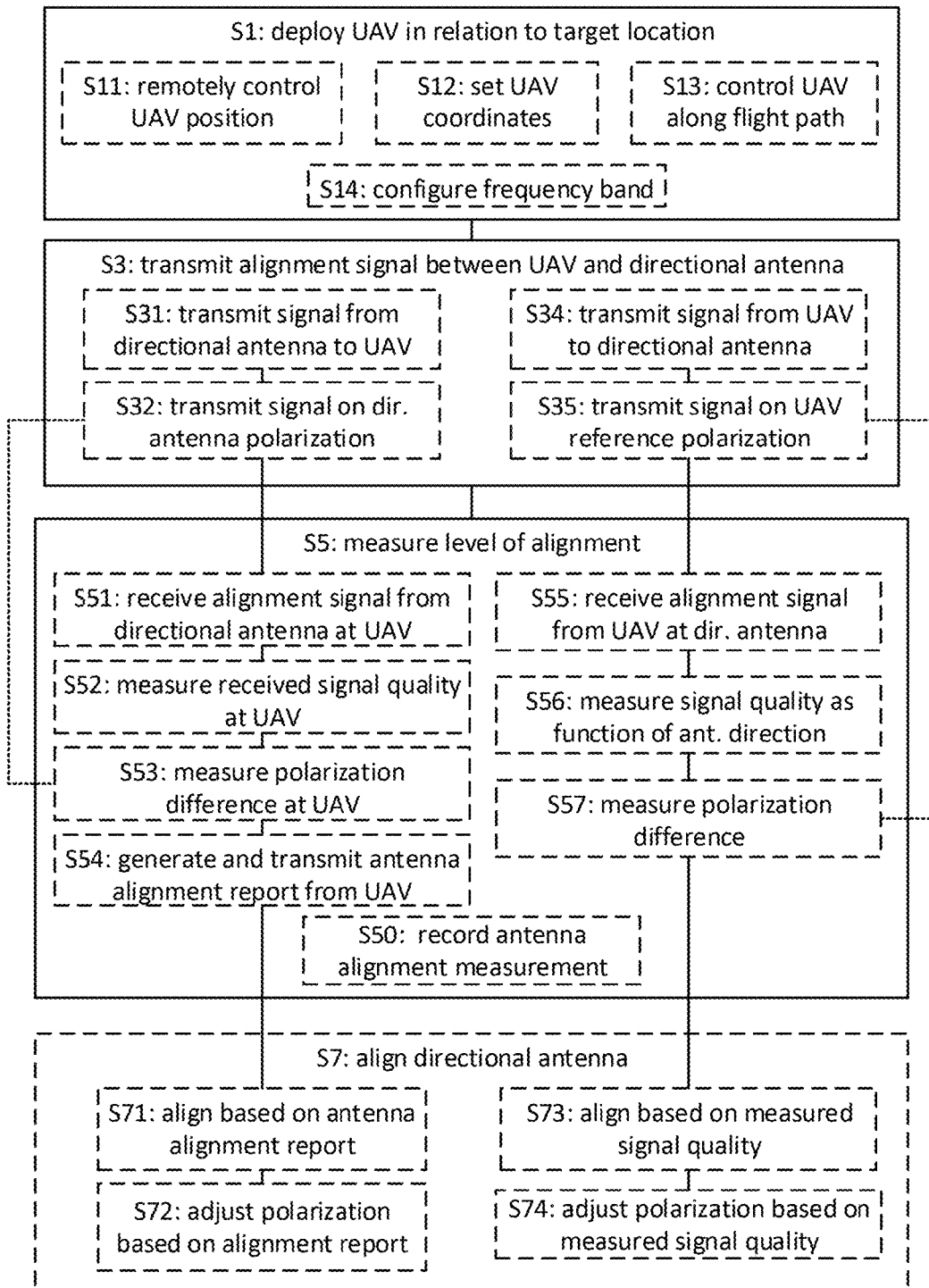
FIG. 7 shows a flowchart illustrating methods according to aspects of the present disclosure.

The techniques and concepts discussed above in connection to FIGS. 2-6 can be described also in terms of methods for measuring antenna alignment of a directional antenna 101. FIG. 7 shows a flowchart illustrating such methods. In particular, there is illustrated a method for measuring antenna alignment of a directional antenna 101 used for wireless communication with respect to a target location X,Y,Z. The method comprises deploying S1 an unmanned aerial vehicle (UAV) in relation to the target location, transmitting S3 an alignment signal 211 between the UAV and the directional antenna, and also measuring S5 a level of antenna alignment of the directional antenna with respect to the target location, based on the alignment signal transmission.

It is appreciated that the target location is not necessarily exactly that of the current or future far-end antenna, but may also be a position in a vicinity of a current or future far-end antenna. This was discussed above in connection to FIG. 3b.

The illustrated method relates to the discussion above in the context of the system 250 for antenna alignment discussed in connection to FIGS. 2 and 3, and the different aspects of UAV 300, 400, 500, 600 discussed in connection to FIGS. 3-6.

In this way, the level of alignment of a directional antenna with respect to a target location can be evaluated independently of any other antennas, such as a corresponding far-end antenna of the directional antenna. Thus, evaluating alignment of a directional antenna with respect to a target location is simplified. Advantageously, antenna alignment condition, i.e., whether a current setting of direction of a directional antenna is a preferred direction or not, with respect to a target location can be determined in an efficient fashion for one or more radio links. Further advantages of the disclosed method have been set out and discussed above, and will not be discussed here again.

It is noted that the method set out above comprises measuring S5 a level of antenna alignment of the directional antenna with respect to the target location but not actually aligning the directional antenna. Hence, the method is also applicable as a diagnostic method for determining a state of alignment of one or more directional antennas with respect to one or more target locations. For instance, a UAV can be flown around in a communication system and used for evaluating radio link alignment. If some radio link is found to have sub-optimal alignment, then this can be communicated to a technician.

Actual aligning of the directional antenna is, according to aspects, performed following said measurement, i.e., according to some aspects, the method further comprises aligning S7 the directional antenna with respect to the target location X,Y,Z by adjusting a direction or orientation of the directional antenna in a direction that improves the measured level of antenna alignment.

Thus, alignment of the directional antenna is achieved independently of any other antennas, such as a corresponding far-end antenna of the directional antenna. By aligning with respect to the UAV instead of with respect to an already active far-end antenna, the process of antenna alignment is simplified, especially during network roll-out. Advantageously, a technician does not need to travel extensively between antenna sites during antenna deployment and alignment.

According to aspects, the measuring comprises recording S50 the measured level of antenna alignment of the directional antenna. This recording can be achieved by means of the memory module 530 discussed in connection to FIG. 5. By recording the measured level of antenna alignment, possibly in connection to a current location of the UAV, an operator can perform a more detailed analysis of directional antenna alignment by accessing the recorded data.

According to aspects, the deploying comprises remotely controlling S11 the position of the UAV in relation to the target location. Such controlling can be achieved by the control module 420 discussed above, which is arranged to control the position of the UAV 400 based on an external control signal 426 received from a remote location via a communications module 425 comprised in the control module 420. This external control signal provides for the possibility of remote control of the UAV, e.g., by means of remote control radio transmitter. Thus, a technician may, e.g., obtain control of the UAV and deploy the UAV manually in relation to the target location or at a position relative to the target location.

According to aspects, the deploying comprises setting coordinates S12 for autonomous operation of the UAV to automatically control the position of the UAV in relation to the target location. As discussed above, such autonomous operation can be achieved by use of the control module 420 in combination with the positioning module 410.

According to aspects, the deploying further comprises controlling S13 the position of the UAV along a flight path 301 in a vicinity of the target location. The flight path 301 was discussed above in connection to FIGS. 3a and 3b.

As already mentioned, the solutions for antenna alignment measurements can be achieved either by transmission of an alignment signal from the UAV to the directional antenna, or by transmission of an alignment signal from the directional antenna to the UAV. With reference to FIG. 7, S31, S32, S51, S52, S53, S54, S71 and S72 mainly relate to the case where the UAV transmits the alignment signal, while S34, S35, S55, S56, S57, S73 and S74 mainly relate to the case where the UAV receives the alignment signal transmission.

Hence, according to aspects where the UAV is receiving the alignment signal, the transmitting comprises generating and transmitting S31 the alignment signal 211a from the directional antenna 101 to the UAV 500.

The measuring then, according to some aspects, comprises receiving S51 the alignment signal from the directional antenna 101 at the UAV 500, and measuring S52 a signal quality of the received alignment signal.

The proposed solution is, according to aspects, also applicable for polarization alignment. Thus, according to some aspects, the transmitting further comprises transmitting S32 the alignment signal on a polarization of the directional antenna, and the measuring comprises measuring S53 a polarization difference between the polarization of the received alignment signal and a reference polarization of the UAV. This polarization difference then serves to indicate a level of polarization alignment between a current polarization of the directional antenna and the reference polarization of the UAV, and thus to facilitate polarization alignment of the directional antenna 101.

According to some aspects, the method further comprises generating and transmitting S54 an antenna alignment level measurement report 220, based on the measuring, from the UAV to a control entity of the directional antenna. This antenna alignment level measurement report 220 indicates a level of alignment of the directional antenna. It can, for instance, be used to improve or evaluate alignment of the directional antenna. In other words, the level of alignment of the directional antenna with respect to the target location can by the present technique be evaluated independently of any other antennas, such as a corresponding far-end antenna of the directional antenna. Thus, evaluating alignment of a directional antenna with respect to a target location is simplified. Advantageously, antenna alignment condition, i.e., whether a current setting of direction of a directional antenna is a preferred direction or not, with respect to a target location can be determined in an efficient fashion for one or more radio links.

Some practical examples of this procedure for generating and transmitting S54 an antenna alignment level measurement report 220 will be given below in connection to FIGS. 8 and 9.

According to aspects, the method further comprises receiving the antenna alignment level measurement report 220 at the control entity of the directional antenna, and aligning S71 the directional antenna with respect to the target location based on the received antenna alignment level measurement report 220.

This implies that alignment of the directional antenna is achieved independently of any other antennas, such as a corresponding far-end antenna of the directional antenna, since the UAV assumes the role of the far-end antenna. Thus, by aligning with respect to the UAV instead of with respect to an already active and coarsely aligned far-end antenna, the process of antenna alignment is simplified, especially during network roll-out. Advantageously, a technician does not need to travel extensively between antenna sites during antenna deployment and alignment.

According to some aspects, the method further comprises adjusting S72 a polarization of the directional antenna based on the antenna alignment level measurement report 220. Consequently, the method not only provides for alignment of direction, but according to aspects also of polarization of a directional antenna. Polarization adjustment was discussed in connection to FIGS. 5 and 6 above.

According to some aspects, the transmitting comprises generating and transmitting S34 the alignment signal from the UAV 600 to the directional antenna 101. This transmission S34 is, according to some aspects, achieved using the transmitter module 610 of the UAV 600 discussed in connection to FIG. 6 above.

According to some aspects, the measuring comprises receiving S55 the alignment signal from the UAV 600 at the directional antenna 101 and measuring S56 a signal quality of the received alignment signal as function of direction of the directional antenna 101. Some different examples of signal quality comprises measured or estimated; received signal strength, bit-error rate, packet-error rate, block-error rate, mutual information between the directional antenna and the UAV, or log-likelihood ratio.

According to some aspects, the transmitting further comprises transmitting S35 the alignment signal on a reference polarization of the UAV, and the measuring comprises measuring S57 a polarization difference between the polarization of the directional antenna and the reference polarization. Again, the method not only provides for alignment of direction, but according to aspects also of polarization of a directional antenna. Polarization adjustment was discussed in connection to FIGS. 5 and 6 above.

According to some aspects, the method further comprises aligning S73 the directional antenna with respect to the target location based on the measured signal quality.

According to some aspects, the method further comprises adjusting S74 a polarization of the directional antenna based on the measured polarization difference.

According to some aspects, the deploying further comprises configuring S14 a frequency band of the alignment signal. Advantageously, antenna alignment can be performed in a frequency band not intended for use in communication over, e.g., a point-to-point radio link comprising the directional radio antenna. Hereby, evaluating antenna alignment, and aligning directional radio antennas, can be achieved without unnecessarily interfering with other radio receivers.

In addition to the methods, there is disclosed herein a computer program comprising computer program code which, when executed in a UAV 200, 300, 400, 500, 600 or in connection to a directional antenna 101, causes the UAV or directional antenna to execute a method as described above.

Figure 8:
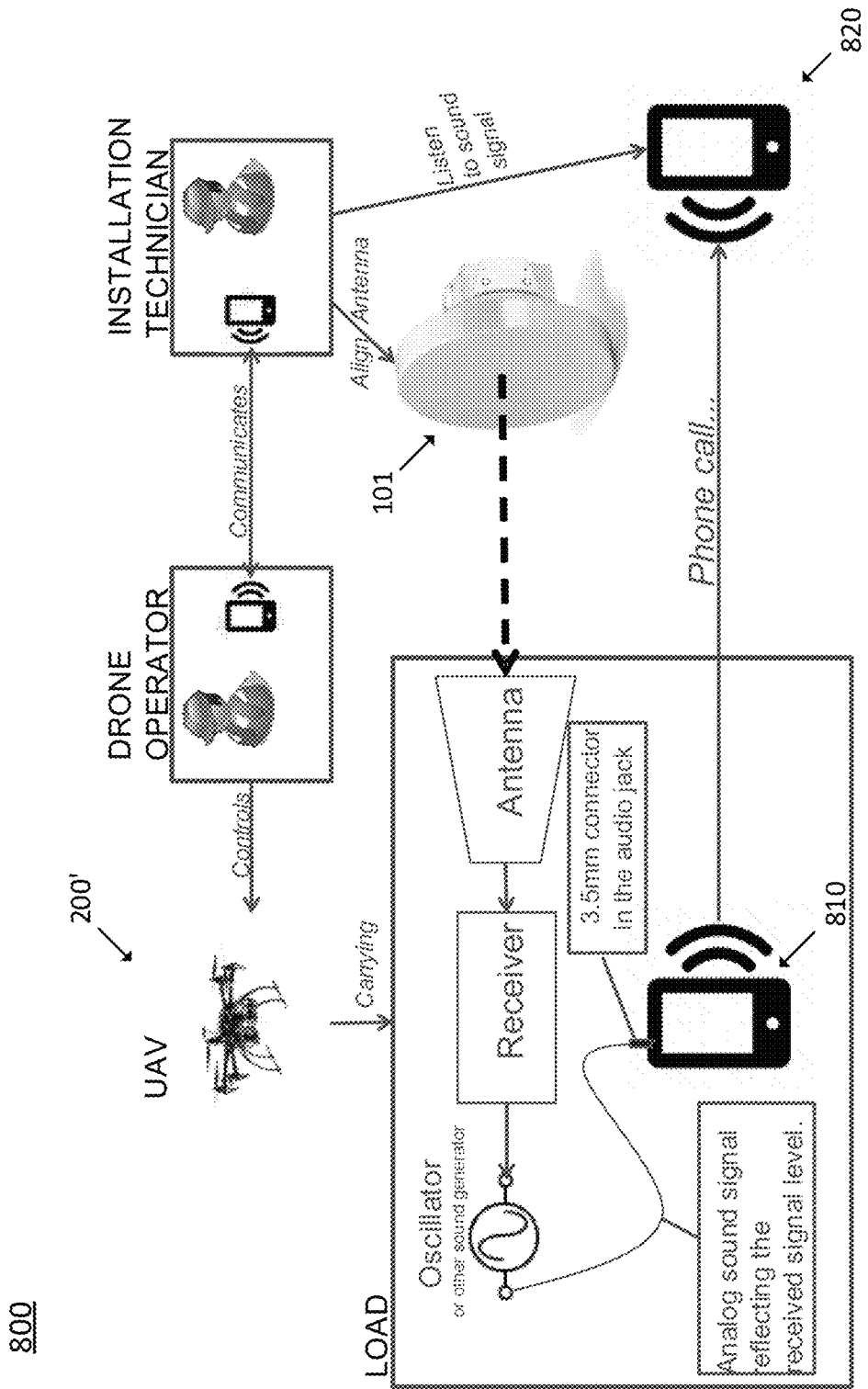
FIGS. 8-9 illustrate antenna alignment of directional antennas according to embodiments.
Figure 9:
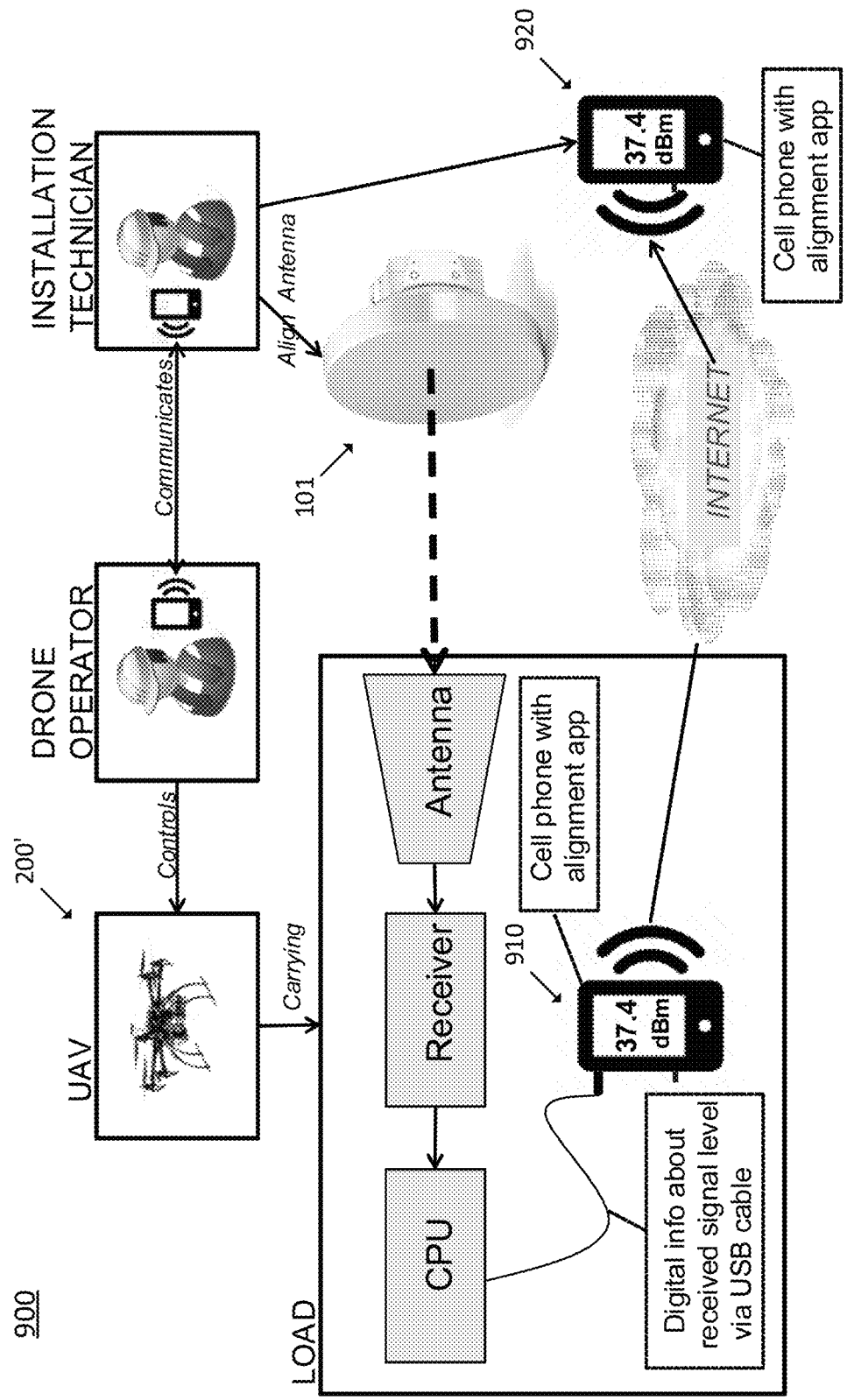

FIGS. 8-9 exemplify antenna alignment of directional antennas according to embodiments. In particular, examples of the methods disclosed herein are given where a directional antenna is aligned with respect to a UAV 200' configured to receive an alignment signal transmitted from the directional antenna.

When mounting a directional antenna, such as a directional microwave radio link dish antenna, the aim is to turn or aim the antenna in the horizontal plane and in the vertical plane until the focal point of its main lobe hits the antenna on the far-end. As discussed above, polarization alignment is also relevant, but will not be discussed here in connection to FIGS. 8 and 9.

Traditionally, alignment of radio link antennas has been done by measuring the signal strength from a sending radio deployed on the far-end. When the received signal at the near-end antenna peaks then the near-end antenna is considered aligned. However, as illustrated and discussed above, advantages are obtained if alignment is instead performed with respect to a UAV instead of with respect to a far-end antenna.

According to the example illustrated in FIG. 8, the UAV, UAS, or drone, has a wireless device, such as a smart-phone, on board (a "drone-phone") 810 which is connected to the UAV receiving antenna via a receiver and a sound generator. The sound generator, for example an oscillator, is creating a sound that has one or more properties reflecting the received signal level. Examples of such sound properties comprise: pitch, volume, intermittent sounds with variable intervals.

Before the UAV is sent up and deployed in relation to the target location, the drone operator (DO) uses the drone-phone to call up an installation technician (IT) that shall perform the antenna alignment. The IT answers the call 820 and listens to the sound signal from the drone-phone using ear-plugs or a head-set so that he or she can work with both hands free.

Compared to the traditional way of aligning antennas using a volt-meter connected to the directional antenna, the IT phone replaces the volt meter for measuring the received radio signal strength and therefore also the current level of alignment.

FIG. 10 shows a flowchart illustrating methods according to aspects of the present disclosure.

If the far-end site is not yet built and a UAV is used then the Installation Technician (IT) and the Drone Operator (DO) may operate according to the following alignment procedure, with reference to FIG. 10;

The DO configures A1 the UAV with the GPS coordinates for the future far-end antenna including altitude;

The DO uses A2 the drone-phone to call up the IT;

The DO sends up A3 the UAV to the prepared location and makes sure that the UAV is oriented so the cone antenna is directed towards the aligning antenna;

The IT makes a rough alignment A4 of the directional antenna towards the UAV using a compass and (if possible) visual sighting of the UAV;

The IT listens to the sound signal in his phone sent from the drone-phone and adjusts the antenna direction until the sound has peaked;

Now the alignment is done. The IT hangs up the call from the drone-phone, calls up the DO and tells him that the alignment is accomplished.

To make it easier to see the UAV it, according to aspects, is equipped with a light source that makes it more visible, as was discussed in connection to FIG. 4.

Turning back to FIG. 9, instead of sending the UAV's received signal level as a sound over a phone-call, the UAV could have a processor that converts the signal level to digital information sent to the drone-phone 910. In this case the drone-phone can have an application, or 'app', that communicates with a corresponding app on the ITs phone 920. In this case the IT can read the current signal level in, e.g., units of dBm, on the phone's display. This phone can also highlight the screen (and give a sound signal) when the level reaches a target value.

The various aspects of the methods described herein are described in the general context of method steps or processes, which may be implemented in one aspect by a computer program product, embodied in a computer-readable medium, including computer-executable instructions, such as program code, executed by computers in networked environments. The computer-readable medium may e.g. be a non-transitory computer-readable medium. A computer-readable medium may include removable and non-removable storage devices including, but not limited to, Read Only Memory (ROM), Random Access Memory (RAM), compact discs (CDs), digital versatile discs (DVD), etc. Generally, program modules may include routines, programs, objects, components, data structures, etc., that perform particular tasks or implement particular abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps or processes.

The invention claimed is:

1. A method for measuring antenna alignment of a directional antenna used for wireless communication with respect to a target location, the method comprising:
identifying a target location associated with a far-end antenna that is not yet deployed, the target location corresponding to a fixed geographic location at which the far-end antenna will be deployed;
aligning the directional antenna towards the target location;
deploying an unmanned aerial vehicle, UAV, in relation to the target location;
transmitting an alignment signal between the UAV and the directional antenna;
measuring a level of antenna alignment of the directional antenna with respect to the target location, based on the alignment signal transmission; and
recalling the UAV upon measuring a peak level antenna alignment of the directional antenna.

2. The method according to claim 1, further comprising aligning the directional antenna with respect to the target location by adjusting a direction of the directional antenna in a direction that improves the measured level of antenna alignment.

3. The method according to claim 1, wherein the measuring comprises recording the measured level of antenna alignment of the directional antenna.

4. The method according to claim 1, wherein the deploying comprises remotely controlling the position of the UAV in relation to the target location.

5. The method according to claim 1, wherein the deploying comprises setting coordinates for autonomous operation of the UAV to automatically control the position of the UAV in relation to the target location.

6. The method according to claim 1, wherein the deploying further comprises controlling the position of the UAV along a flight path in a vicinity of the target location.

7. The method according to claim 1, wherein the transmitting comprises generating and transmitting the alignment signal from the directional antenna to the UAV.

8. The method according to claim 7, wherein the measuring comprises receiving the alignment signal from the directional antenna at the UAV, and measuring a signal quality of the received alignment signal.

9. The method according to claim 7, wherein the transmitting further comprises transmitting the alignment signal on a polarization of the directional antenna, and wherein the measuring comprises measuring a polarization difference between the polarization of the received alignment signal and a reference polarization of the UAV.

10. The method according to claim 7, further comprising generating and transmitting an antenna alignment level measurement report, based on the measuring, from the UAV to a control entity of the directional antenna.

11. The method according to claim 10, when dependent on claim 2, further comprising receiving the antenna alignment level measurement report at the control entity of the directional antenna, and aligning the directional antenna with respect to the target location based on the received antenna alignment level measurement report.

12. The method according to claim 10, further comprising adjusting a polarization of the directional antenna based on the antenna alignment level measurement report.

13. The method according to claim 1, wherein the transmitting comprises generating and transmitting the alignment signal from the UAV to the directional antenna.

14. The method according to claim 13, wherein the measuring comprises receiving the alignment signal from the UAV at the directional antenna and measuring a signal quality of the received alignment signal as function of direction of the directional antenna.

15. The method according to claim 13, wherein the transmitting further comprises transmitting the alignment signal on a reference polarization of the UAV, and wherein the measuring comprises measuring a polarization difference between the polarization of the directional antenna and the reference polarization.

16. The method according to claim 13, further comprising aligning the directional antenna with respect to the target location based on the measured signal quality.

17. The method according to claim 15, further comprising adjusting a polarization of the directional antenna based on the measured polarization difference.

18. The method according to claim 1, wherein the deploying further comprises configuring a frequency band of the alignment signal.

19. The method according to claim 8, wherein signal quality comprises any of measured or estimated;
received signal strength,
bit-error rate,
packet-error rate,
block-error rate,
mutual information between the directional antenna and the UAV,
log-likelihood ratio.

20. The method of claim 1, further comprising illuminating a light source on the UAV.

* * * * *